United States Patent
Asanuma

[11] Patent Number: 5,824,361
[45] Date of Patent: Oct. 20, 1998

[54] METHOD FORMING A UNIFORM PHOTORESIST FILM USING GAS FLOW

[75] Inventor: Yuji Asanuma, Saku, Japan

[73] Assignee: TDK Corporation, Tokyo, Japan

[21] Appl. No.: 831,183

[22] Filed: Apr. 2, 1997

Related U.S. Application Data

[63] Continuation of Ser. No. 510,661, Aug. 3, 1995, abandoned.

[30] Foreign Application Priority Data

Aug. 5, 1994 [JP] Japan .................................. 6-184625

[51] Int. Cl.⁶ ..................................................... B05D 3/04
[52] U.S. Cl. ............................... 427/127; 427/348; 118/63
[58] Field of Search .................................. 427/240, 127, 427/348, 242; 118/52, 63

[56] References Cited

U.S. PATENT DOCUMENTS

| | | | |
|---|---|---|---|
| 4,447,467 | 5/1984 | Oguchi et al. | 427/348 |
| 4,870,519 | 9/1989 | White | 360/103 |
| 5,358,740 | 10/1994 | Bornside et al. | 427/240 |

FOREIGN PATENT DOCUMENTS

| | | | |
|---|---|---|---|
| 57-122063 | 7/1982 | Japan . | |
| 60-101781 | 6/1985 | Japan . | |
| 61-278087 | 12/1986 | Japan . | |
| 63-95626 | 4/1988 | Japan | 118/52 |
| 2-246067 | 10/1990 | Japan . | |
| 3-1902215 | 8/1991 | Japan . | |
| 3-212811 | 9/1991 | Japan . | |
| 4 61952 | 2/1992 | Japan . | |
| 4-132011 | 5/1992 | Japan . | |
| 4-274014 | 9/1992 | Japan . | |
| 4-356765 | 12/1992 | Japan . | |
| 6-283417 | 10/1994 | Japan | 118/52 |
| 7-105650 | 4/1995 | Japan . | |

*Primary Examiner*—Katherine A. Bareford
*Attorney, Agent, or Firm*—Oblon, Spivak, McClelland, Maier & Neustadt, P.C.

[57] ABSTRACT

A method for forming a photoresist film on a substrate, includes mounting a substrate on a supporting surface of a supporter so that a stepped portion is produced between the supporting surface and a top surface of the substrate; coating a photoresist on the top surface and a side surface of the substrate, the side surface showing up at the stepped portion; and then; blowing gas over the photoresist on the top surface to make the photoresist a uniform film.

2 Claims, 7 Drawing Sheets

METHOD FORMING A UNIFORM PHOTORESIST FILM USING GAS FLOW

This application is a Continuation of application Ser. No. 08/510,661, filed on Aug. 3, 1995, now abandoned.

BACKGROUND OF THE INVENTION

1. Field of the Invention

The present invention relates to a method for forming a photoresist film. Preferable application of the method for forming a photoresist film according to the present invention is e.g. a magnetic head fabrication process.

2. Discussion of Background

In a photolithographic process well-known as a high-accuracy pattern formation technique, after coating a photoresist on a surface to be processed, a photomechanical technique such as exposure and development is used to subject the photoresist to patterning and to obtain a patterned photoresist required for processing, and then etching is made to obtain a required fine shape. When the photoresist is coated, a dip-coating process, a spin-coating process and so on have been utilized.

The conventional technique as stated above creates a problem in that the photoresist film heaves at an edge portion of the substrate to make film thickness uneven because of adoption of the dip-coating process or the spin-coating process as the photoresist coating process. Uneven film thickness lowers patterning accuracy in the photolithographic process.

SUMMARY OF THE INVENTION

It is an object of the present invention to provide a method for producing a magnetic head, capable of equalizing the film thickness of a photoresist film on a surface to be processed, and establishing the pattern precision by use of the photoresist film with high accuracy.

It is another object of the present invention to provide a method for producing a magnetic head, capable of not only equalizing the film thickness of a photoresist film on a surface to be processed but also forming a sufficient etching preventing film on a portion which must not be processed.

The foregoing and other objects of the present invention have been attained by providing a method for forming a photoresist film on a substrate, comprising mounting a substrate on a supporting surface of a supporter so that a stepped portion is produced between the supporting surface and a top surface of the substrate; coating a photoresist on the top surface and a side surface of the substrate, the side surface showing up at the stepped portion; and then; blowing gas over the photoresist on the top surface to make the photoresist thin film.

Preferably, the method includes use of a gas supply nozzle. The gas supply nozzle is scanned relatively with respect to the top surface of the substrate.

An example of the substrate includes a magnetic head assemblage wherein a plurality of magnetic head elements are arranged in a direction. The top surface of the substrate is constituted by surfaces of the magnetic head elements, which are used as medium opposing surfaces respectively.

In accordance with the photoresist film forming method of the present invention, after coating the photoresist on the top surface of the substrate, the gas is blown over the photoresist on the top surface to make the photoresist thin film. As a result, the photoresist which has been coated on the top surface of the substrate is drawn by the gas flow to form a photoresist film which has a thin and even film thickness over the entire top surface of the substrate. This gives a basis which is required to establish pattern precision by use of the photoresist film with high accuracy. Since equalizing the photoresist film thickness and making the photoresist into a thin film is done by the gas, the operation can be made easily.

Because the substrate is mounted on the supporter so that a stepped portion is produced between the supporting surface of the supporter and the top surface of the substrate and the photoresist is coated on the side surface which shows up at the stepped portion, the side surface of the substrate has a thick photoresist film formed thereon, which works as a sufficient etching preventing film or adhering preventing film during a dry etching process etc. In this manner, the film thickness of the photoresist film on the top surface of the substrate to be processed can be equalized, and at the same time the etching preventing film and the adhering preventing film can be sufficiently formed on the side surface of the substrate which must not be processed.

The gas is blown over the photoresist coated on the top surface of the substrate not only to draw the photoresist by the gas flow but also to blow away an unnecessary portion of the photoresist. The blown portion of the photoresist gets together with the portion of the photoresist which has adhered on the side surface of the substrate. As a result, the photoresist on the side surface is made further thicker enhancing the functions as the etching preventing film and the adhering preventing film.

The present invention is widely applicable to micromachining technology. One of specific applications is application to a method for producing a thin film magnetic head. In a specific example, the substrate includes a magnetic head assemblage wherein a plurality of magnetic head elements are arranged in a direction, and surfaces of the magnetic head elements, which are used as medium opposing surfaces, respectively, form the photoresist coated surface. In this case, a photoresist film which has a thin and even film thickness is formed on the medium opposing surfaces as air bearing surfaces on the magnetic head assemblage, and thereby giving a basis for applying a high-accuracy shape to the air bearing surfaces.

As explained, the present invention can offer the following advantages.

(a) A photoresist film forming method can be provided which equalizes the film thickness of a photoresist film on a surface to be processed, and pattern precision by use of the photoresist film can be enhanced.

(b) A photoresist film forming method can be provided which equalizes the film thickness of a photoresist film on a surface to be processed, and simultaneously can form a sufficient etching preventing film on a portion which must not be processed.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figures 1A, 1B:
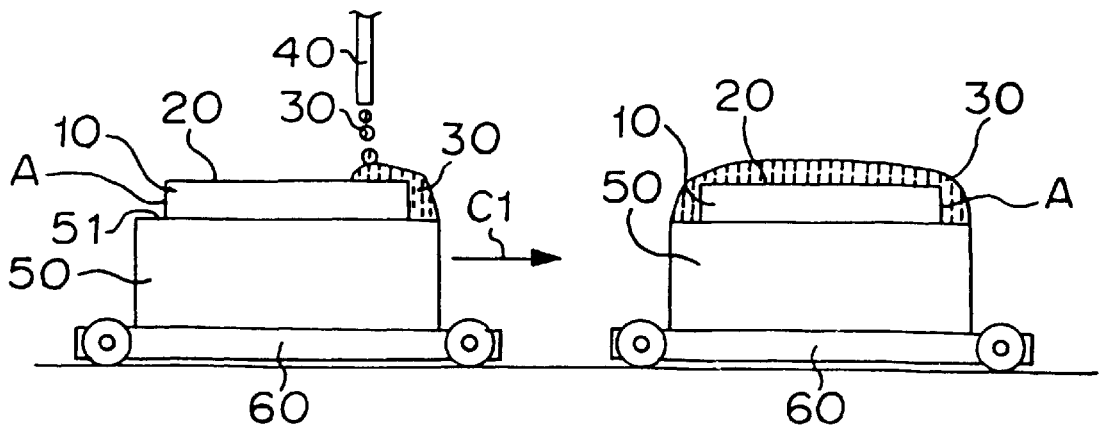
FIGS. 1(a) and (b) are schematic views of an embodiment of the photoresist coating step included in the photoresist film forming method according to the present invention.
Figures 2A, 2B:
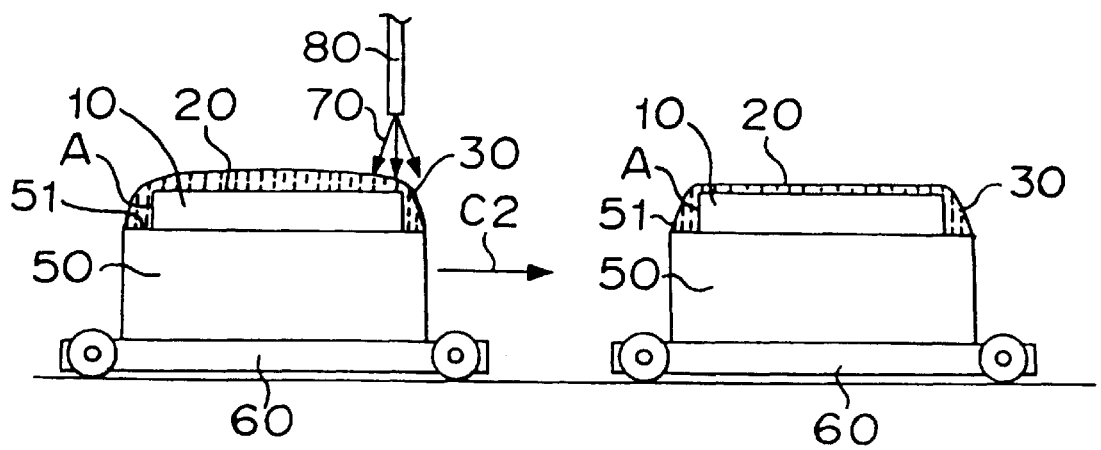
FIGS. 2(a) and (b) are schematic views of an embodiment of the gas blowing step included in the photoresist film forming method according to the present invention.

Referring to the drawings wherein the same reference numerals designate the same or corresponding parts, and more particularly to FIGS. 1(a) and (b), and FIGS. 2(a) and (b), there are respectively shown a photoresist coating step in FIGS. 1(a) and (b), and a gas blowing step in FIGS. 2(a) and (b). In FIG. 1(a), there is shown a state wherein a photoresist is being coated. In FIG. 1(b), there is shown a state wherein the photoresist has been coated. As shown in FIG. 1(a), a substrate 10 is mounted on a supporter 50 by means of bond or a mechanical coupling. Between a top surface 20 of the substrate 10 and a supporting surface 51 of the supporter 50 are produced stepped portions A.

First, as shown in FIG. 1(a), the top surface 20 of the substrate 10 and the stepped portions A have a photoresist 30 coated thereon. As measures to supply the photoresist, there are a dip-coating technique, a drip technique and so on. In FIG. 1(a), there is shown the drip technique, wherein a photoresist supply nozzle 40 is used, and the photoresist 30 drips from the photoresist supply nozzle 40 onto the top surface 20 of the substrate 10 and the stepped portions A. The supporter 50 is transferred by a carrier 60 in a direction indicated by an arrow C1. It is preferable that the photoresist 30 is coated on the top surface 20 of the substrate 10 and the stepped portions A during the transfer.

Figure 3:
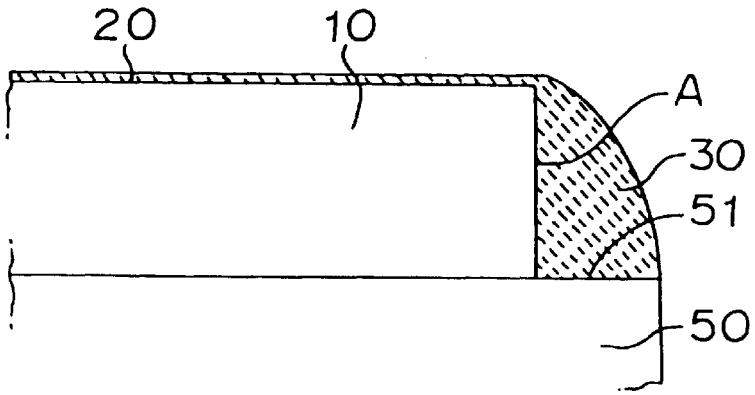
FIG. 3 is a schematic view showing how the photoresist film is coated after the step of FIG. 2.
Figure 4:
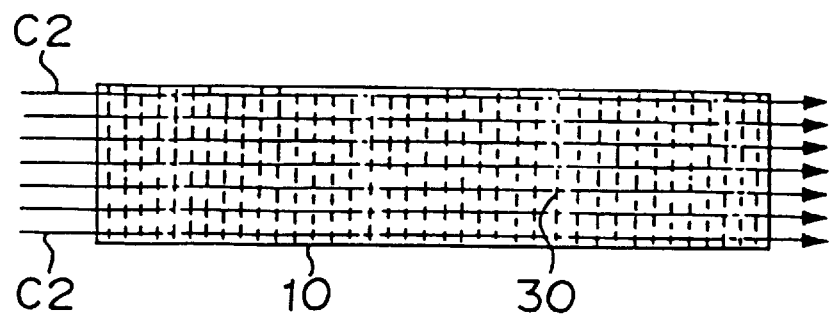
FIG. 4 is a schematic view showing an example of the scanning direction of a gas supply nozzle with respect to the photoresist.

Next, as shown in FIG. 2(a), gas 70 which is supplied from a compressed gas source (not shown) is blown to the photoresist 30 to make it a thin film. As a result, the photoresist film 30 is formed to have a thin and even film thickness over the entire surface of the top surface 20 of the substrate 10 as shown in FIGS. 2(b) and FIG. 3. As the gas 70 is selected e.g. air or gaseous nitrogen. As the gas supply means is used a gas supply nozzle 80. It is preferable that the gas supply nozzle 80 is scanned relatively with respect to the top surface 20 of the substrate 10 as indicated an arrow C2. Scanning the gas supply nozzle is carried out by moving the gas supply nozzle 80 itself or moving the carrier 60 which supports the substrate 10 and the supporter 50.

Figure 5:
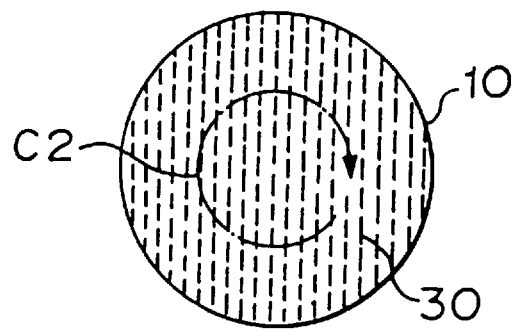
FIG. 5 is a schematic view showing another example of the scanning direction of the gas supply nozzle with respect to the photoresist.
Figure 6:
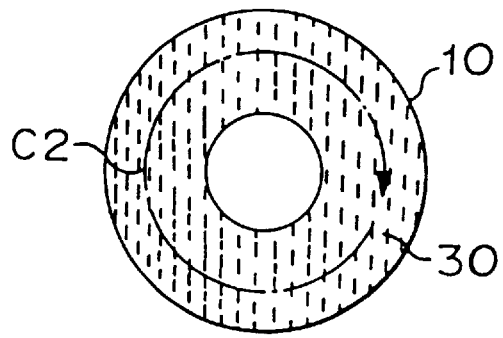
FIG. 6 is a schematic view showing a further example of the scanning direction of the gas supply nozzle with respect to the photoresist.
Figure 7:
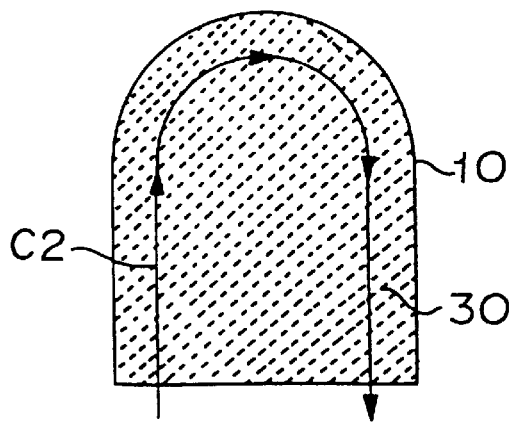
FIG. 7 is a schematic view showing another further example of the scanning direction of the gas supply nozzle with respect to the photoresist.

The scanning direction, range and the like of the gas supply nozzle 80 vary with the shape of the substrate 10, the tip shape of the gas supply nozzle 80 or the like. In FIGS. 4 through 9, there are shown specific examples. When the planar shape of the top surface of the substrate 10 is rectangular, scanning is linearly made along the longitudinal direction or the width direction of the top surface as indicated in arrows C2 in FIG. 4. When the planar shape of the top surface of the substrate 10 is circular, scanning can be circularly made around the center of the top surface 20 as shown in FIGS. 5 and 6. When the planar shape of the top surface 20 of the substrate 10 is a combination of a circular arc shape of a rectangular shape, scanning can be made in a U-turn manner as shown in FIG. 7.

Figure 8:
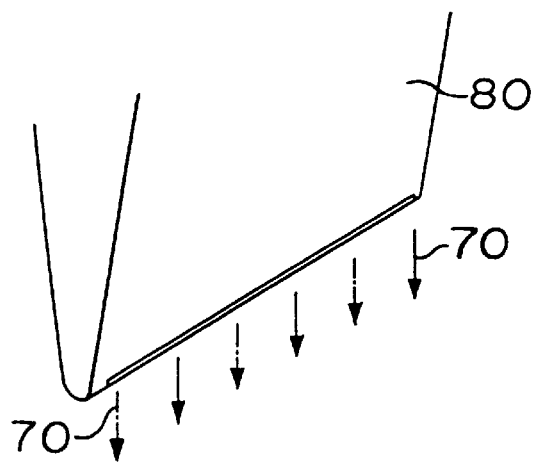
FIG. 8 is a perspective view showing an example of the gas supply nozzle.
Figure 9:
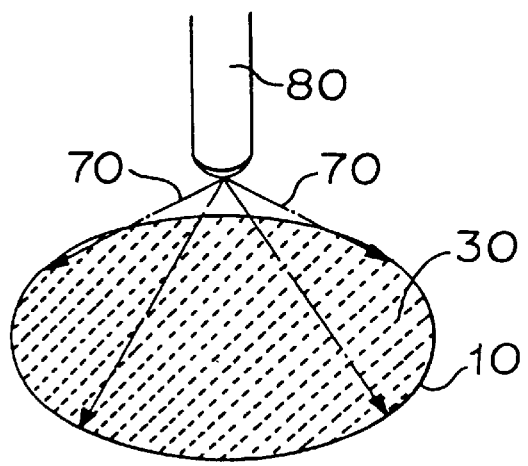
FIG. 9 is a perspective view showing another example of the gas supply nozzle.

The tip shape of the gas supply nozzle 80 may be linear as shown in FIG. 8, or be so spot-shaped to radiate the gas, having the tip of the nozzle as the center, as shown in FIG. 9.

As explained, since the gas 70 is blown over the photoresist 30 to make it thin film after coating the photoresist 30 on the top surface 20 of the substrate 10, the photoresist 30 which has been coated on the top surface 20 of the substrate 10 can be drawn by the gas flow to form a photoresist film 30 with a thin and even film thickness over the entire surface of the top surface 20 of the substrate 10 as shown in FIG. 2(b). This can provide a basis which is required to enhance the pattern precision by use of the photoresist film 30 with high-accuracy. In addition, because equalizing the film thickness of the photoresist film and making the photoresist into a film is done by blowing the gas 70, the operation is easy.

Since the substrate 10 is mounted on the supporter 50 so that the stepped portions A are produced between the supporting surface 51 of the supporter 50 and the top surface 20 of the substrate 10, and the photoresist 30 is coated on side surfaces of the substrate as well, which show up at the stepped portion A, the side surfaces of the substrate 10 have thick portions of the photoresist film 30 formed thereon. Those portions of the photoresist film work as an etching preventing film and an adhering preventing film in a dry etching step and so on. In this manner, not only the film thickness of the photoresist film 30 on the top surface 20 to be processed can be equalized, but also the etching preventing film and adhering preventing film can be simultaneously formed, in a sufficient manner, on the side surfaces which must not be processed.

In addition, the gas is blown over the photoresist 30 on the top surface 20, causing the gas flow 70 to draw the photoresist 30 coated on the top surface 20 of the substrate 10 and to blow away unnecessary portions of the photoresist 30. As a result, the portions of the photoresist 30 on the side surfaces are made further thicker to enhance the functions of the etching preventing film and the adhering preventing film.

Now, a case wherein the photoresist film forming method according to the present invention is applied to micromachining technology of an air bearing surface of a magnetic head will be described in detail.

Various magnetic heads wherein a peculiar shape is applied to an air bearing surface have been proposed to minimize a skew angle dependency in flying characteristics in a magnetic head to keep flying height constant and stabilize a flying posture from the inner periphery to the outer periphery of a magnetic disk, or to improve magnetic recording/readout characteristics. In e.g. JP-A-60-101781, there is disclosed a magnetic head slider wherein slider rails have the central rail in the longitudinal direction formed to be narrower in width than the opposite end rails to minimize the skew angle dependency.

In JP-A-4-356765, there is disclosed a magnetic head wherein rail portions have an upper surface formed with an air bearing surface having an inner edge and outer edge, and the inner edge and the outer edge are converged from a front edge of the slider toward points of inflection and are diverged from the points of inflection toward the rear edge of the slider to restrict a fluctuation in flowing characteristics with respect to skew angles. In JP-A-2-246067, there is disclosed a slider for a magnetic disk device, wherein rails are formed to get gradually narrower in width from an air inlet end toward an air outlet end.

In addition, in JP-A-4-274014, there is disclosed a technique wherein a pole portion formed on an air bearing surface has an end portion in a width direction or a thickness (longitudinal) direction formed with a recess having a minute depth, setting the width of the pole portion in a track direction with high-accuracy, or improving electromagnetic conversion characteristics.

As another technique in addition to the prior art stated above, there has been known a TPC (Transverse Pressurization Contour) type of slider. The TPC type of slider has been disclosed in JP-A-61-278087, JP-U-57-122063 (Japanese Utility Model Application No. 56-5818), U.S. Pat. No. 4,673,996, U.S. Pat. No. 4,870,519 and so on. The TPC type of slider has side portions of rail portions formed with minute recesses over their entire length. When the TPC type of slider is incorporated into a rotary actuator type of magnetic recording and reproducing device, air flow entering from a lateral direction creates a lift dynamic pressure in the recesses at a position having a great skew angle, to prevent a decrease in flying height at the great skew angle position, keeping a constant flying height from the inner periphery to the outer periphery of a magnetic disk and stabilizing a flying posture.

Application of such a shape to the air bearing surface has to be carried out by micromachining technology. In conventional measures for the micromachining technology, a required fine shape has been obtained by coating a photoresist on an air bearing surface as a surface to be processed, using a photolithographic process to subject the photoresist film to patterning to get a pattern required for processing, and then carrying out etching. Etching is normally carried out by a dry etching step such as milling, and the photoresist is coated by a dip-coating process or a spin-coating process or the like.

One of the problems in the conventional technology as stated above is that since the dip-coating process or the spin-coating process is adopted as the photoresist coating process, and the photoresist film obtained by such a coating process is subjected to the photolithographic process, the photolithographic process has been forced to be carried out on the photoresist film which has such an uneven film thickness that the film heaves at an edge portion on the substrate. The photolithographic process under the uneven state in the film thickness creates a decrease in patterning precision. In JP-A-3-190215, there is disclosed a technique as measures to solve the problem in the spin-coating process, wherein a rectangular substrate to be processed has one edge portion cut out in a slant shape, and the substrate is set in such a manner that the slanted edge portion is directed to a rotational direction between the center of rotation and a peripheral edge portion on a spin holder, which requires use of a special substrate to be processed.

The photoresist film forming method according to the present invention is applicable to various micromachining techniques stated above, and can solve the problem as discussed above.

Figure 10:
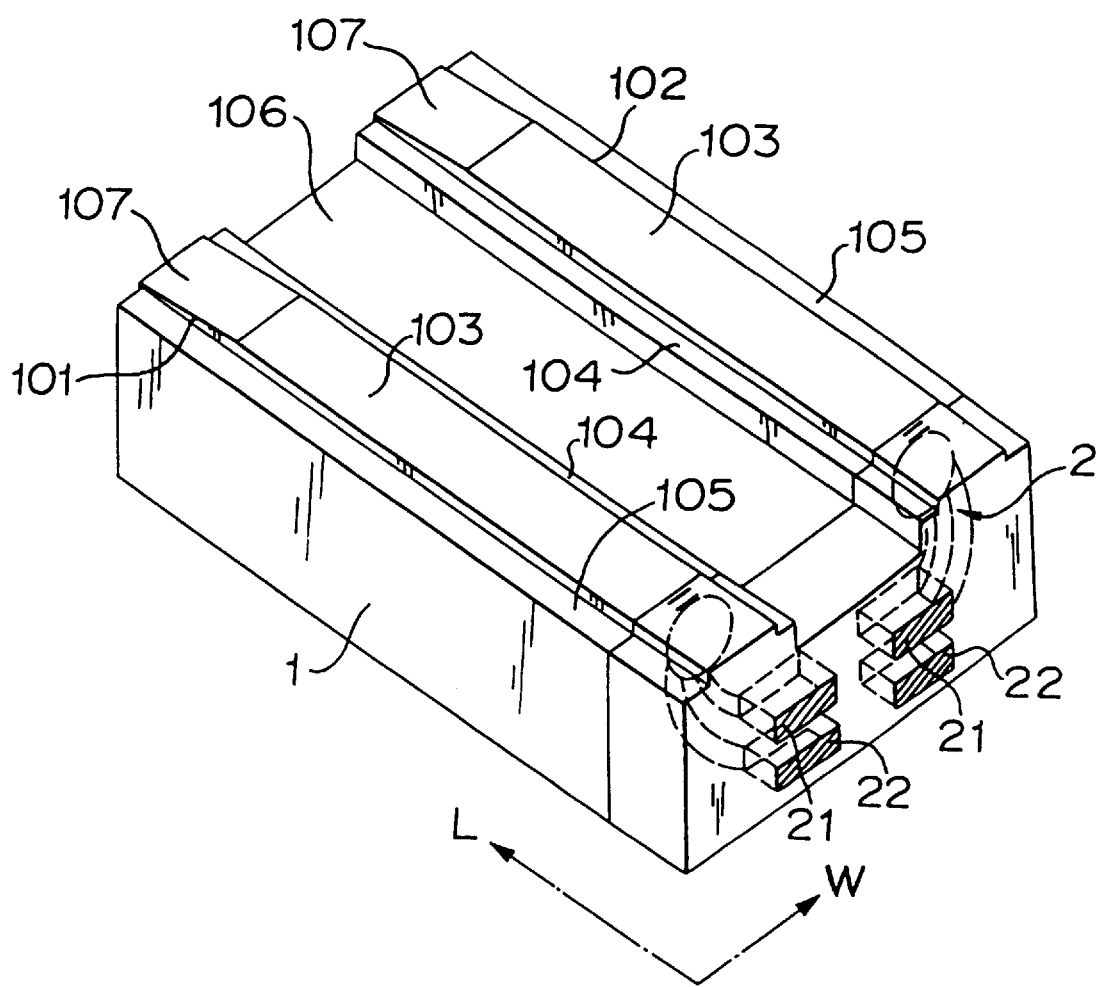
FIG. 10 is a perspective view of a magnetic head.

In FIG. 10, there is shown a perspective view showing an example of the magnetic head which can be obtained by the producing method according to the present invention. In FIG. 10, dimensions are exaggerated. Referring to FIG. 10, the magnetic head includes a slider 1 and magnetic transducing elements 2. Supposing a longitudinal direction L and a width direction W on a medium opposing surface, the slider 1 has at least one rail portion 101 or 102 which extend in the longitudinal direction L on the side of the medium opposing surface. The rail portions 101 and 102 have the side of the medium opposing surface provided with air bearing surfaces 103 and recesses 104 and 105. The air bearing surfaces 103 are formed over the entire length in the longitudinal direction L.

The magnetic transducing elements 2 are provided in a side surface at one end surface of the slider 1 in the longitudinal direction L, and on extension of the rail portions 101 and 102. The magnetic transducing elements 2 are generally constituted by thin film elements. The magnetic transducing elements 2 may be an inductive type, an MR (magnet-resistance effect) type or a combination thereof. Those elements can be constituted by thin film elements which are produced by a process similar to an IC fabrication technology. In addition, the present invention is applicable not only to a longitudinal magnetic recording system but also a perpendicular magnetic recording system.

The rail portions 101 and 102 are provided in pairs as a general structure, and the rail portions are mostly formed in parallel, having a gap therebetween. In such a case, the gap between the rail portions 101 and 102 forms a slot 106 which drops from the air bearing surfaces 103 and the recesses 104. The air bearing surfaces 103 have tapered surfaces 107, respectively, on the other end which is opposite to the end surface where the magnetic transducing elements 2 are positioned. One rail portion, or more than two rail portions may be provided. Reference numerals 21 and 22 designate take off electrodes.

The production method according to the present invention is applicable to forming the recesses 104 and 105 as stated above. A specific example will be explained with reference to FIGS. 11 through 18.

Figure 11:
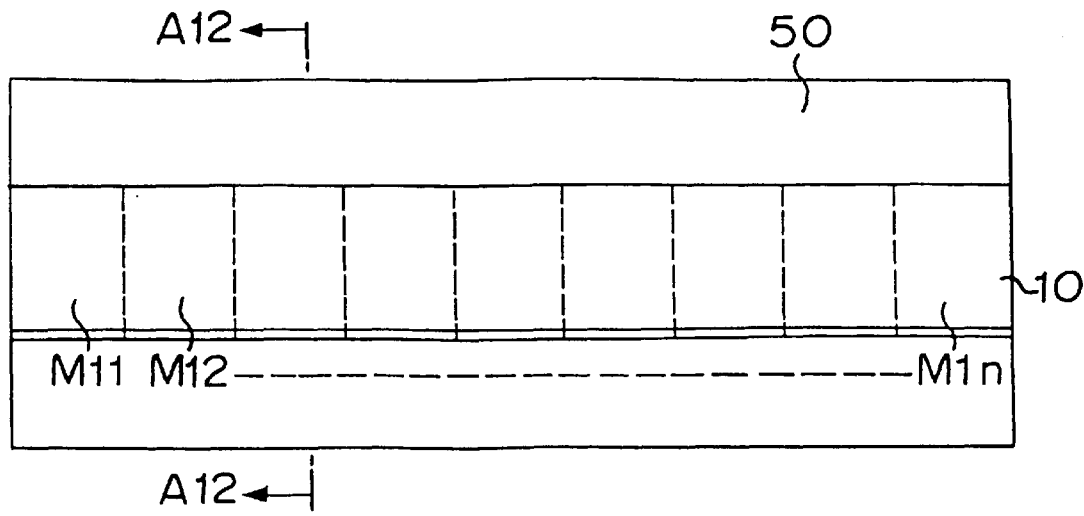
FIG. 11 is a plan view showing an example of the magnetic head fabrication process to which the photoresist film forming method according to the present invention is applied.

First, a magnetic head assemblage 10 is arranged on the supporter 50 as shown in FIG. 11. The magnetic head assemblage 10 is constituted by arranging a plurality of magnetic head elements M11–M1n in one direction, and are placed on the supporter 50 in such a manner that surfaces of the magnetic head elements M11–M1n to be processed as medium opposing surfaces are directed upward. It is preferable that a polishing step for air bearing surfaces and a process for applying tapered surfaces to the air bearing surfaces have been carried out before the process according to the present invention is carried out.

Figure 12:
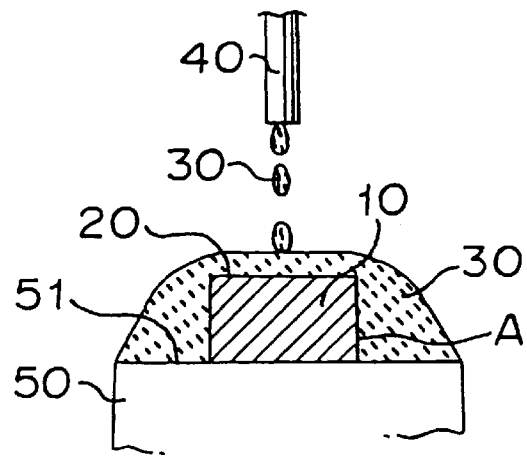
FIG. 12 is a partially cross-sectional view taken along the line A12—A12 of FIG. 11.
Figure 13:
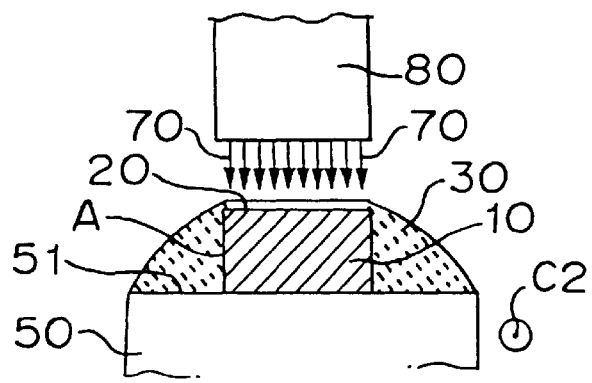
FIG. 13 is a partially cross-sectional view showing an example of the gas blowing step included in the magnetic head fabrication process to which the photoresist film forming method according to the present invention is applied.
Figure 14:
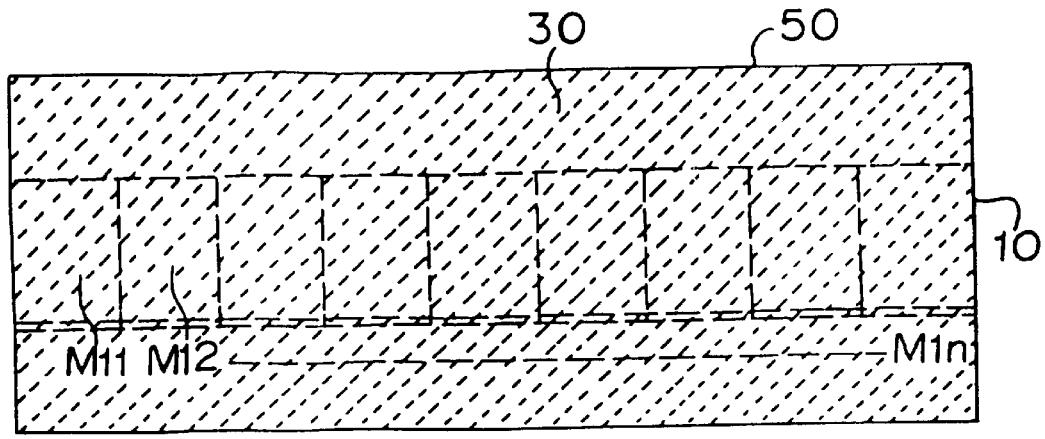
FIG. 14 is a plan view showing the state after the step shown in FIG. 13.

Next, the photoresist 30 is coated on the top surface 20 of the magnetic head assemblage 10 and the stepped portions A as shown in FIG. 12. Then, the gas 70 is blown over the photoresist 30 to make it filmy as shown in FIG. 13. As a result, the magnetic head assemblage 10 is obtained which has the medium opposing surfaces as the air bearing surfaces coated by the photoresist film 30 with a thin and even film thickness. This can give a basis for applying shape processing to the air bearing surfaces with high-accuracy in a step explained later on.

Because the magnetic head assemblage 10 is mounted on the supporter 50 so that the stepped portions A are produced between the supporting surface 51 of the supporter 50 and the top surface 20 of the magnetic head assemblage 10, and the photoresist 30 is coated on the side surfaces of the assemblage which show up at the stepped portions A, the photoresist film 30 is formed on the side surfaces of the magnetic head assemblage 10 in a thick manner. The photoresist film 30 on those side surfaces works as an etching preventing film and an adhering preventing film in a dry etching step and so on. In that manner, the film thickness of the photoresist film 30 on the top surface 20 as a surface to be processed can be equalized, and simultaneously the etching preventing film and the adhering preventing film can be obtained at the side surfaces not required for process, in a sufficient manner.

Figure 15:
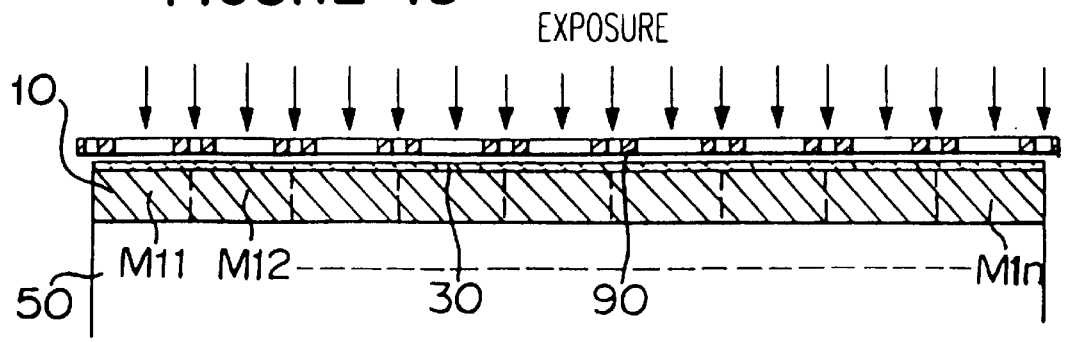
FIG. 15 is a cross-sectional view showing an exposing step after the step shown in FIG. 14.

In addition, the gas 70 is blown over the photoresist 30 on the surface 20, causing the gas flow to draw the photoresist 30 coated on the top surface 20 of the magnetic head assemblage 10 and to blow away an unnecessary portion of the photoresist. As a result, the photoresist 30 on the side surfaces is made further thicker, highly enhancing the functions of the etching preventing film and the adhering preventing film. Next, a photomask 90 is put on the photoresist film 30 formed on the top surface of the magnetic head assemblage 10, and the exposure is done as shown in FIG. 15. The photomask 90 has a pattern which is required to obtain the recesses 104 and 105, the slot 106 and so on in the magnetic head shown in FIG. 10.

Figure 16:
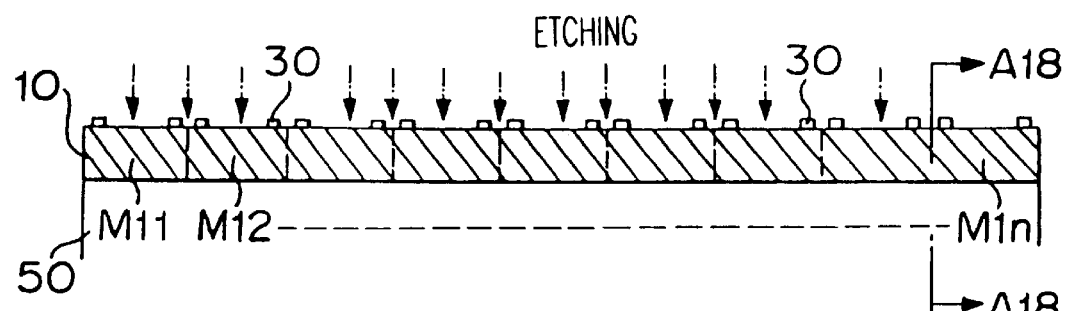
FIG. 16 is a cross-sectional view showing an etching step after the step of FIG. 15.
Figure 18:
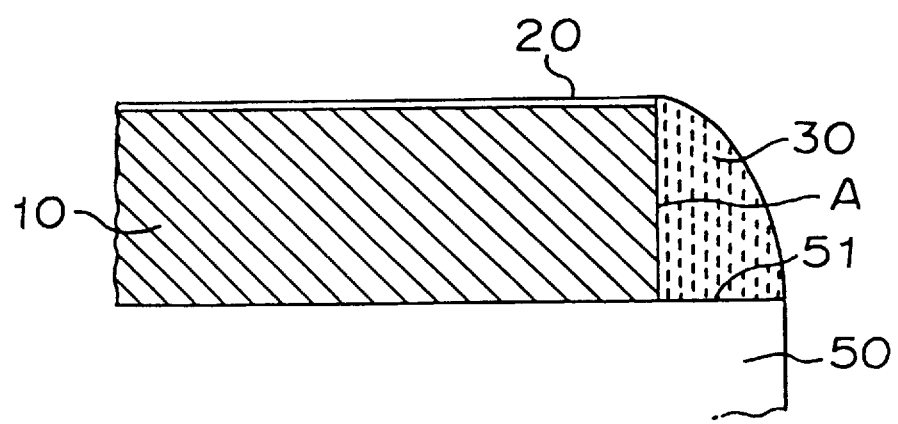
FIG. 18 is a partially cross-sectional view taken along the line A18—A18 of FIG. 16 in enlargement.

After the photoresist film is subjected to patterning by development, dry etching is carried out, using the remaining photoresist film 30 as a mask as shown in FIG. 16. A typical example of dry etching is milling. Since the magnetic head assemblage 10 has the side surfaces coated with the thick photoresist film 30 as shown in FIG. 18, fine particles which have been produced form the magnetic head assemblage 10 by the dry etching can prevent from adhering on both side surfaces of the magnetic head assemblage 10, from which the sliders are produced. As a result, there is no possibility that damage due to a magnetic head adhering particle is given to a magnetic disk or a magnetic head.

Figure 17:
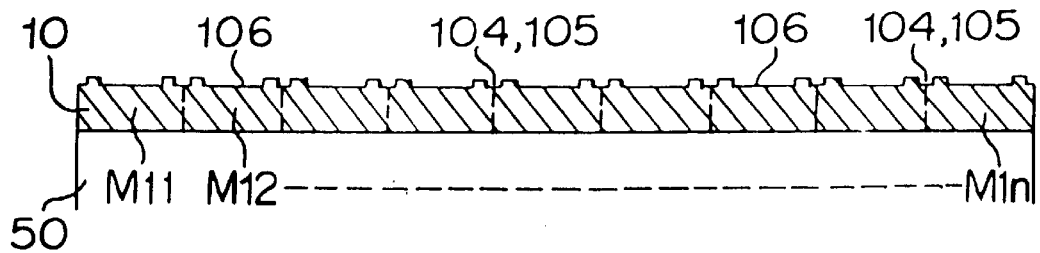
FIG. 17 is a cross-sectional view of the magnetic head assemblage which has been obtained through the step shown in FIG. 16.

The recesses 104 and 105, and the slot 106 are formed through the dry etching step as shown in FIG. 17. After necessary machining process is carried out, and the magnetic head elements M1–Mn are discretely cut out.

Although detailed explanation is omitted, the present invention is significantly useful as measures to form a recess in a case wherein a pole portion formed on the air bearing surface has an end portion in a width direction or a thickness (longitudinal) direction formed with a recess having a minute depth, to set the width of the pole portion in a track direction with high-accuracy or to improve electromagnetic conversion characteristics.

Obviously, numerous modifications and variations of the present invention are possible in light of the above teachings. It is therefore to be understood that within the scope of the appended claims, the invention may be practiced otherwise than as specifically described herein.

What is claimed is:

1. A method for forming a substantially uniform photoresist film on a substrate, comprising the steps of:

mounting a substrate on a supporting surface of a supporter so that a stepped portion is produced between the supporting surface and a top surface of the substrate;

forming a non-uniform photoresist coating on a top surface and a side surface of the substrate, the side surface showing up at the stepped portion; and then;

blowing a gas onto the photoresist on the top surface from a gas supply nozzle, in such a way that the flow of the gas makes the photoresist a film having a substantially uniform thickness, and scanning said gas relative to said top surface, during said blowing step, along a path having at least one linear portion by moving the gas supply nozzle with respect to the top surface of the substrate.

2. A method for forming a photoresist film according to claim 1, wherein a plurality of magnetic head elements are arranged in a direction; and wherein the top surface of the substrate is constituted by surfaces of the magnetic head elements.

* * * * *